United States Patent [19]

Srivastava

[11] Patent Number: 4,904,970

[45] Date of Patent: Feb. 27, 1990

[54] SUPERCONDUCTIVE SWITCH

[75] Inventor: Vishnu C. Srivastava, Florence, S.C.

[73] Assignee: General Electric Company, Milwaukee, Wis.

[21] Appl. No.: 157,205

[22] Filed: Feb. 17, 1988

[51] Int. Cl.$^4$ .............................................. H01F 7/22
[52] U.S. Cl. .................................. 335/216; 174/125.1; 338/32 S
[58] Field of Search .............. 335/216; 174/15.4, 15.5, 174/125.1; 338/32 S

[56] References Cited

U.S. PATENT DOCUMENTS

| | | | |
|---|---|---|---|
| 3,715,703 | 2/1973 | Croso et al. | 338/32 S |
| 4,010,047 | 3/1977 | Frohmader | 148/20.3 |
| 4,164,777 | 8/1979 | Kneip et al. | 338/32 S |
| 4,586,017 | 4/1986 | Laskaris | 338/32 S |
| 4,602,231 | 7/1986 | Purcell et al. | 335/216 |
| 4,635,015 | 1/1987 | Franksen | 335/216 |

OTHER PUBLICATIONS

"Critical Current and Stability Effects Between 0 and 6 Tesla in Mono and Multifilamentary NbTi Conductors Having a CuNi Matrix", H. H. J. ten Kate, A. J. M. Roovers and L. J. M. van de Klundert, *IEEE Transactions on Magnetics,* vol. MAG-21, pp. 363-365, Mar. 1985.

Primary Examiner—George Harris
Attorney, Agent, or Firm—Quarles & Brady

[57] ABSTRACT

A superconducting switch is bifilarly wound with two cupro-nickel matrix superconductors. Three layers of the wire is wound, with each layer of windings wrapped with four wires in hand and input and output portions of the wires adjacent to one another. This configuration and relationship between adjacent wires is maintained throughout all the layers of the entire winding. The windings are started 180° apart and input and output leads are extracted 180° degrees apart. The switch also includes a core around which the wires and a heater are wound, a casing to enclose the core, heater and wire windings, and a solid epoxy body which fills substantially all of the voids in the switch. Switch leads are stabilized using a copper channel in which they are soldered to avoid quenching when they are subjected to a high current in a magnetic field, and the copper channel is surrounded and soldered to a copper braid. This construction results in a stable superconductive switch which is noninductive, has a high current carrying capacity and off resistance, and which reduces cryogen boil-off during charging and discharging of a high energy magnet circuit. The switch can also keep the magnetic field drifts of a magnet to less than 0.1 ppm/hour.

13 Claims, 3 Drawing Sheets

SUPERCONDUCTIVE SWITCH

BACKGROUND OF THE INVENTION

1. Field Of The Invention

This invention relates to a thermally controlled persistent current switch for high energy superconductive magnets, and more particularly to such a switch employing a cupro-nickel matrix superconductor.

2. Discussion Of The Prior Art

Switches for turning superconductive magnet circuits on and off are well known. They typically comprise a length of superconductive wire and a heater element. The switch is cooled to a temperature well below the critical temperature of the superconductor (e.g., 9° Kelvin) by immersing it in a cryogen such as liquid helium. At or below the critical temperature, the resistance of the wire falls to zero, thereby making the wire superconductive. In the superconductive or persistent state, the switch is "on" because it has no resistance. The switch is turned off by turning the heater element on, which raises the temperature of the superconductive wire above the critical temperature, thereby producing a finite resistance to the flow of current.

The coils of superconductive switches are made up of as many turns of superconductive wire as are necessary to achieve the desired resistance in the "off" state and provide a great enough heat capacitance in the switch to avoid damage when the switch is off. In prior switches which have employed copper matrix superconductor, a very long wire has been required to achieve even a relatively small resistance. Because of the small resistance, the switch also had to be able to absorb large amounts of energy. For example, in one such switch, 2200 feet of copper matrix superconductor was required to achieve a resistance of approximately 0.05 $\Omega$ at 10°–20° K. In the application of a superconducting switch to the charging circuit of a superconducting magnet, a higher resistance is desirable because it allows less energy absorption by the switch when it is off, thereby reducing the boil-off of the cryogen during charging and discharging of the magnet.

Another consideration in superconductive switches is current carrying capacity. High current carrying capacity (e.g. 500 Amperes or more) when "on" is desirable and required in some applications. Copper matrix switches have generally been capable of high current densities, but at the expense of the relatively poor "off" characteristics referred to above.

Cupro-nickel matrix superconductors are known, but they have not been successfully employed in high current superconductive switches. Such superconductors are inherently extremely unstable. Slight movements in a magnetic field can cause them to "quench", losing their ability to conduct at zero resistance.

SUMMARY OF THE INVENTION

The invention overcomes the above problems with a superconducting switch which has a core, a heater element wrapped around the core, plural turns of two or more cupro-nickel matrix superconducting wires wrapped around the core, a casing enclosing the core, heater element and wire turns, and a solid body filling the voids between the casing and the core to restrain the wire against movement. This produces a switch with a small amount of superconductor but which has a high resistance and is stable in a magnetic field at high operating currents.

Each wire is bifilarly wound so that it has an input portion on one side of its middle and an output portion on the other side. Preferably, the input portions and output portions are wound adjacent to one another. If more than one layer is wound and two wires are used, the four wire portions should be wound continuously so that their order is the same in each layer. This configuration and relationship between the input and output sections of the wires is maintained throughout the entire winding, which may consist of one or more numbers of layers. Also, the windings of the wires should be started 180° apart and the input portions should be extracted from the switch 180° apart from the exit portions. These aspects help produce a switch which is noninductive to minimize any magnetic field the switch produces.

The ends of the superconducting wire exiting the switch are preferably in electrical continuity with a stabilizer of an electrical conductivity higher than the cupro-nickel matrix. Each stabilizer should be embedded in the solid body inside the switch and extend into any superconducting joint made between the corresponding switch lead and a lead from the magnet circuit in which the switch is to be incorporated. Additional support in the form of a copper braid may also be added around each lead for additional strength and stability.

It is therefore a principal object of the invention to provide a superconducting switch using cupro-nickel matrix superconducting wire which has a high current carrying capacity (e.g., up to 1,500 amperes in a field of 1 Tesla).

It is another object of the invention to provide a superconducting switch which is smaller and uses less superconductor than prior switches with similar ratings.

It is another object of the invention to provide such a superconducting switch which is stable in a magnetic field.

It is another object of the invention to provide such a superconducting switch which has a relatively high resistance above the critical temperature.

It is another object of the invention to provide such a superconducting switch which has a relatively lower cryogen (liquid helium) boil-off during charging and discharging of a high energy magnet connected in parallel with it.

It is another object of the invention to keep the field drifts for the magnet circuit connected in parallel with it to less than 0.1 ppm/hour.

It is another object of the invention to provide such a superconducting switch which does not interfere with a magnetic field.

These and other objects of the invention will be apparent from the drawings and from the detailed description.

DETAILED DESCRIPTION OF THE PREFERRED EMBODIMENT

Figure 1:
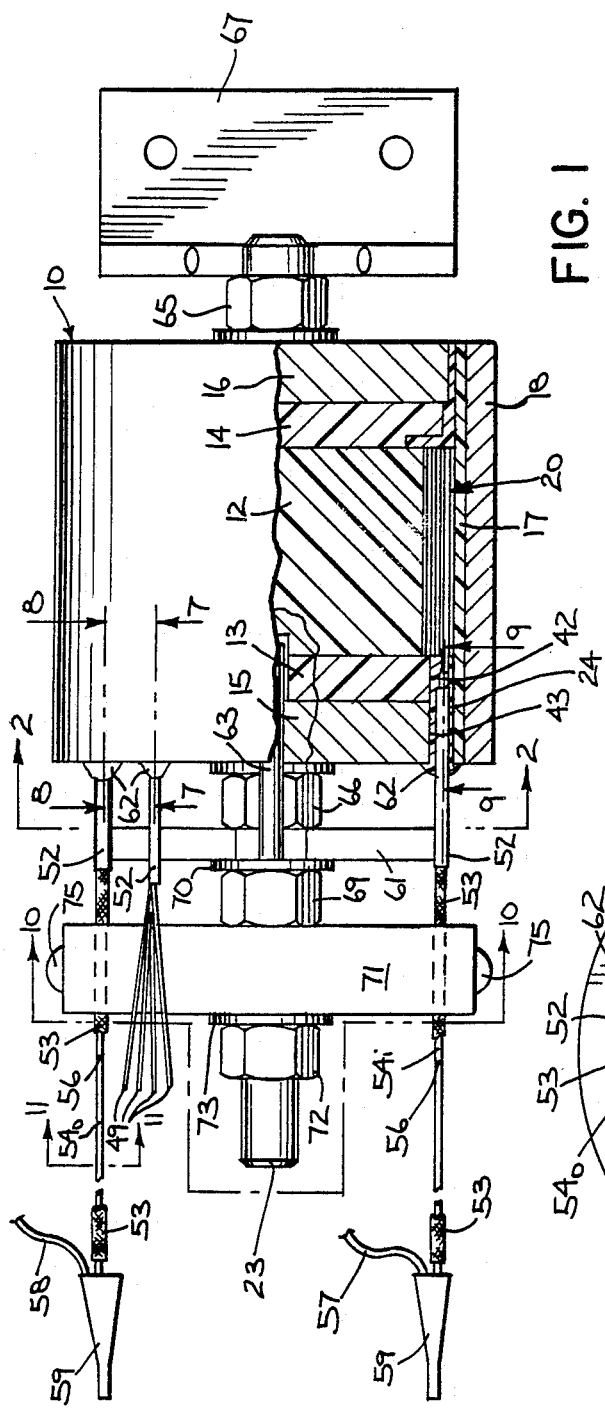
FIG. 1 is a side elevation view of a switch of the present invention illustrated with a portion broken away.

FIG. 1 shows a superconducting switch 10 of the present invention. The switch 10 is particularly adapted for use in a charging circuit of a high energy superconducting magnet which produces a field of about 0.5 Tesla (T). Further explanation of how the switch 10 could be incorporated in a charging circuit for a superconducting magnet is available in U.S. Pat. No. 4,586,017, the disclosure of which is hereby incorporated by reference.

The switch 10 includes a solid glass-epoxy composite core 12, inner nylon end plates 13 and 14, outer aluminum end plates 15 and 16, a nylon sleeve 17, an aluminum housing 18 and windings generally designated 20 around the core including layers of wound cupro-nickel matrix superconductors 22. A stud 23 helps hold the assembly together and the entire assembly is vacuum impregnated with an epoxy 24. When the epoxy cures, a solid epoxy body fills the voids in the switch and fixes the windings against movement within the switch when the wires are placed in a magnetic field. Otherwise, even a slight movement of the wires could initiate a quench because cupro-nickel matrix superconductors are extremely unstable in a magnetic field, particularly at high current densities.

Figure 3:
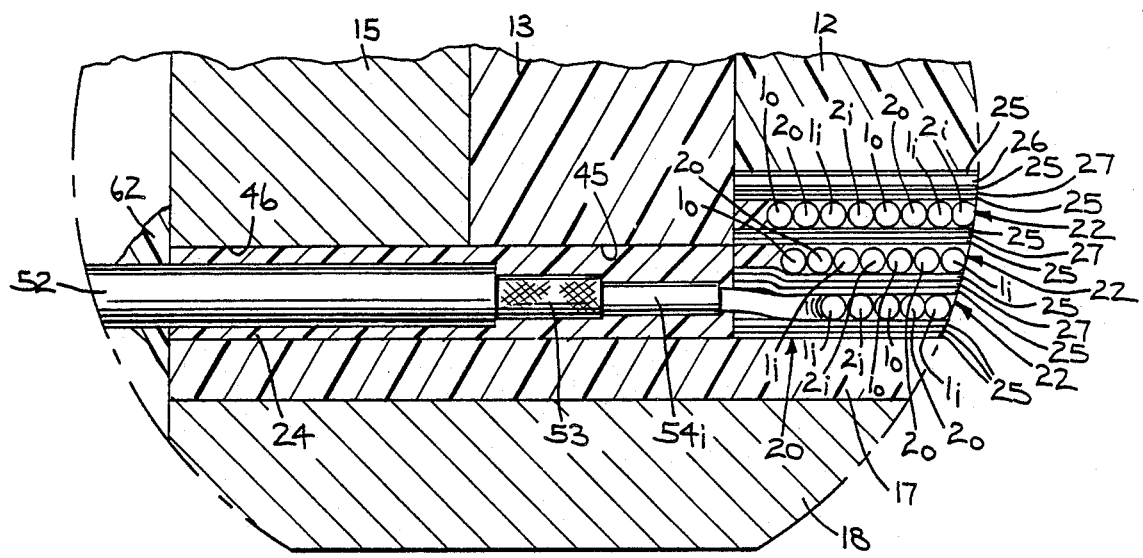
FIG. 3 is a detail view of a portion of FIG. 1 illustrating the area where a superconducting lead exits the switch.

Referring to FIG. 3, the windings 20 are made of layers of the superconducting wire 22, epoxy compatible glass felt 25, and formvar coated copper sheets 27. A sheet 26 having a pair of axially side-by-side nickel-chromium alloy foil heaters embedded in it is wrapped around the core 12 radially inward from the windings 20 with a layer of glass felt 25 approximately 0.003" thick between the sheet 26 and the core 12. In this embodiment, the resistance of each heater is nominally 5.3 ohms. Two heaters are preferred so that if one of the heaters malfunctions, the other can be relied upon.

Another layer of epoxy-compatible glass felt 25 approximately 0.006–0.009 inches thick is wound over the sheet 26 for support and electrical insulation and a copper sheet 27 is laid over the glass felt layer. The sheet 27 spreads the heat from the sheet 26, see U.S. Pat. No. 4,586,017 referred to above. The sheet 26 may also be provided with a similar thermally conducting sheet integral with it, in which case the copper sheet 27 is not necessary. If the sheet 27 is used, it is followed by another layer of epoxy-compatible glass of about 0.009" before beginning winding the superconducting wires.

Figure 4:
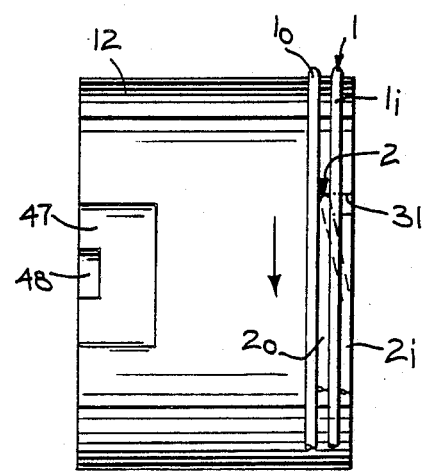
FIG. 4 is a side elevation view of a core for the switch illustrating how the wire windings are started around the core.
Figure 5:
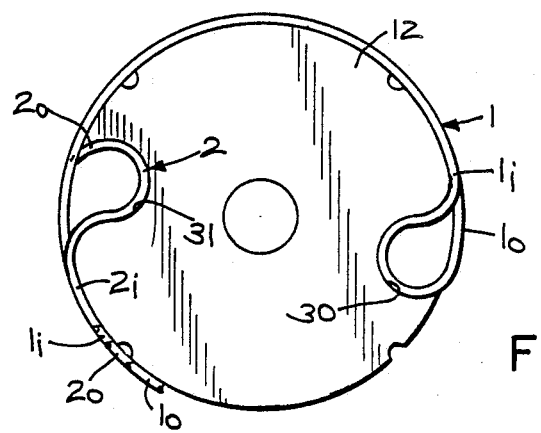
FIG. 5 is a right end elevation view of the core of FIG. 4 also illustrating the beginning of the wire windings.

Each wire is bifilarly wound around the core so as not to produce any appreciable magnetic field (which may interfere with a main magnetic field). Each wire is bifilarly wound by starting the winding at the core in the middle of the wire. Referring to FIGS. 4 and 5, the middle of one of the wires, designated 1, is looped into a recess 30 in the end of the core 12. On one side of the middle, this wire is designated "i" for input and the other side is designated "o" for output. Thus, current through the wire 1 travels in one direction through portion 1i and in the other direction through portion 1o.

The wire 1 is wound about halfway (180°) around the core in the direction indicated in FIG. 4 and the other wire, designated 2, is started in the same way and direction by looping its middle around the recess 31 in the end of the core, with its ends on either side of the middle also being similarly designated "i" and "o". The recess 31 is at least two wire diameters deep so that end 2o can cross under end 1i and come out between ends 1i and 1o, as illustrated in FIG. 4. Thus, the "i" ends of the wires 1 and 2 are adjacent and the "o" ends of the wires 1 and 2 are also adjacent. As such, the wires alternate within each layer. As shown in FIG. 4, the starting side-by-side relationship of the wires is 1-2-1-2 (from the left), and more particularly, 1o-2o-1i2i. The cross-under of end 2o under end 1i is packed with fiberglass to avoid any regions of unsupported epoxy in the final switch greater than 0.010 inches thick.

With four conductors in hand, arranged as described above, three layers of the wires 1 and 2 are wound on the core 12. As the wires are wound, a tension of about 10 lbs. is applied to each wire. When the end of a layer is reached, a layer of epoxy-compatible glass felt 25 nominally 0.009 inches thick is wrapped over the layer. Then, another copper sheet 27 is wrapped over the glass felt, followed by another layer of glass felt nominally 0.009 inches thick.

The next layer of superconducting wire is then started over the last layer of glass felt. The wire of this layer is wound in the same rotary direction, and with the wire in the same order as, the last layer. Thus, if the order at the end of the first layer as shown in FIG. 3 is 1o-2o-1i-2i, (from the left; the same as at the beginning of this layer as shown in FIG. 4), the order will also be 1o-2o-1i-2i, as shown in the second layer, and this will be the case for all of the layers. Thus, in cross section, when the wires are viewed in groups of "o's" and "i's", the groups alternate within each layer and from layer to layer are axially offset from one another by one-half of a wire diameter. The areas at the ends/beginnings of the layers where the wires go from one layer to another are packed with fiberglass so as to avoid any unsupported thicknesses of epoxy greater than 0.010 inches.

This procedure is repeated for each of the layers until the third layer of superconducting wire has been wound. Outside of the third layer of superconducting wire, epoxy-compatible glass felt is wound to an outside diameter which will allow the nylon sleeve 17 to be slid over the glass felt without rumpling it, but will not allow regions of epoxy without support more than 0.010 inches thick upon impregnation.

Figure 8:
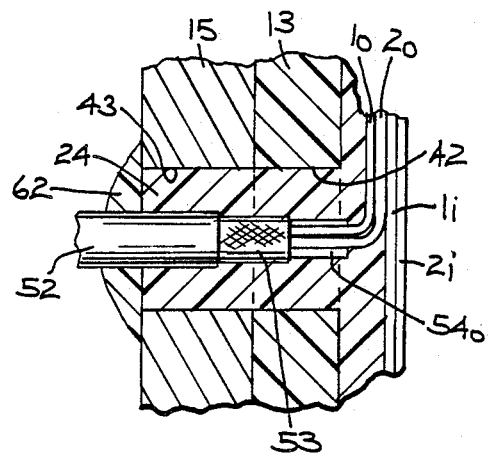
FIG. 8 is a sectional view taken from the plane of the line 8—8 of FIG. 1.
Figure 9:
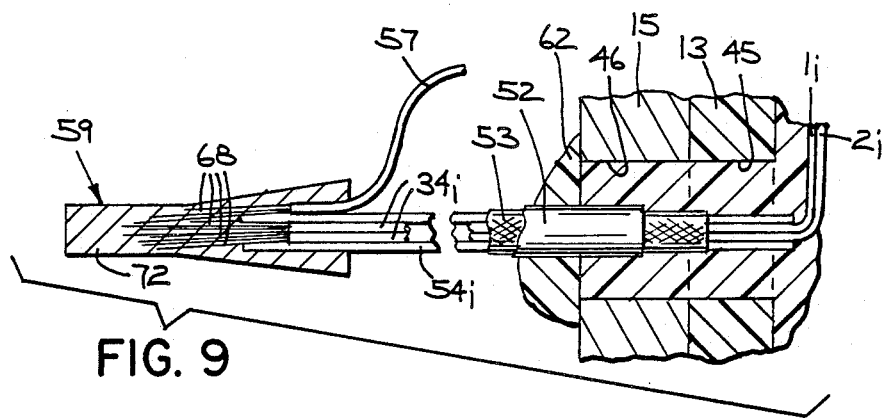
FIG. 9 is a sectional view taken from the plane of the line 9—9 of FIG. 1 and also illustrating a superconducting joint.

The superconducting wires 1 and 2 are extracted from the switch at the end opposite from the end of the core 12 having the recesses 30 and 31. The ends 1i and 2i form superconducting lead 34i an the ends 1o and 2o form superconducting lead 34o, for connection to a superconducting circuit. Adjacent wires 1o and 2o (FIG. 8) are bent at 90 degrees and exit the switch through recesses 42 and 43 in the end plates 13 and 15, respectively. The ends 1i and 2i continue around the core for approximately another half revolution and are brought out through the recesses 45 and 46 in the end plates 13 and 15, respectively, as shown in FIG. 9.

Figure 6:
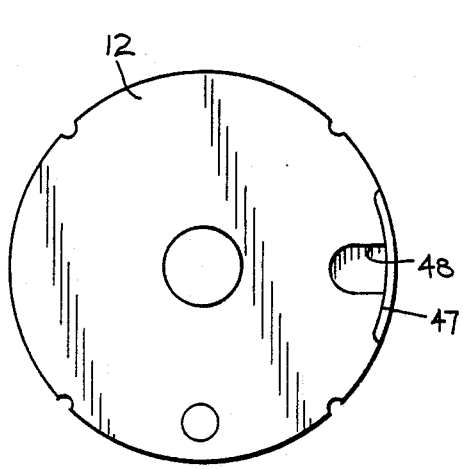
FIG. 6 is a left end elevation view of the core of FIG. 4, but not showing the wire windings.
Figure 7:
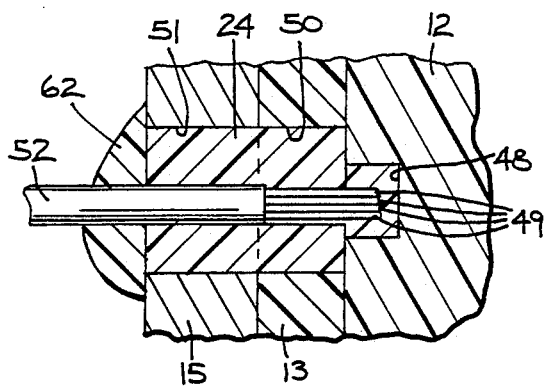
FIG. 7 is a sectional view taken from the plane of the line 7—7 of FIG. 1.

The core (FIG. 6) also has recesses 47 and 48 to allow routing heater leads 49 (four total, two from each heater element) through passageways 50 and 51 (FIG. 7) defined by the end plates 13 and 15, respectively. A suitable piece of electrically insulating tubing 52 encloses the heater leads out through the passageway 51.

The superconducting wire inside the switch is stabilized by fixing the wires 1 and 2 against movement. However, the superconducting leads 34i and 34o cannot be so fixed because they must be movable to be connected with a superconducting joint to a circuit, such as the charging circuit for the main magnet coils of an MR scanner.

Figure 11:
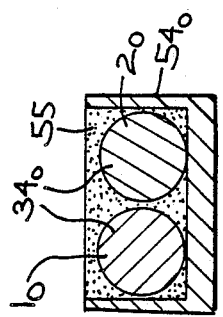
FIG. 11 is a sectional view taken from the plane of the line 11—11 of FIG. 1.

To stabilize the leads 34o and 34i outside of the switch, each lead is in electrical contact along its length by means of solder 55 with a channel 54o or 54i made of OFHC (oxygen free high conductivity) copper. The channels 54o and 54i should be deep enough so the leads 34o and 34i can be covered with solder 55 within them. The construction for lead 34o is shown in FIG. 11. Each channel 54o or 54i extends into the switch and has its inside end embedded in the epoxy which impregnates the switch as shown in FIGS. 8 and 9. Each channel 54o or 54i and the corresponding leads 34o or 34i extend for a distance suitable to make a joint at the end thereof with leads 57 and 58, respectively, from the circuit in which the switch is to be incorporated and these leads should be firmly secured for their entire length, such as by clamping them to a stationary structure without allowing unsupported lengths of more than about 1–2 inches. In the preferred embodiment, this distance is approximately four feet. Also, more than one channel may be overlapped for additional strength and soldered together, as indicated by the lines 56 in FIG. 1.

Further support is provided for the leads 34i and 34o where they exit the switch and adjacent thereto by tubular OFHC copper braid 53. The braid 53 surrounds and is soldered to each channel 54o and 54i, with the solder substantially filling any voids between the braid and the corresponding channel and lead pair. The braid 53 extends into the switch and is embedded in the epoxy which impregnates the switch, and extends outside of the switch and through the support 71 to support the leads adjacent to the switch. Preferably, the braid should extend for substantially the entire length of the leads 34i and 34o for additional strength and stability. Electrically insulating Teflon tubing pieces 52 surround the braid 53 out through the end plate 15. In addition, sealant compound 62 is applied around the tubing 52 and heater leads 49 where they exit the end plate 15.

FIG. 9 shows a superconducting joint 59 at the free end of the lead 34i and channel 54i. As shown, the copper channel 54i also extends into the joint 59, and the lead 34i extends somewhat past the end of the channel 54i. The braid 53 could also, if desired, extend into the joint 59. This joint made between the superconductors 1i and 2i and the superconductor 57, which typically has a copper matrix, is made according to the method fully described in commonly owned U.S. patent application Ser. No. 07/157,345, entitled Method And Apparatus For Making A Superconducting Joint, filed concurrently herewith, which is hereby incorporated by reference. Briefly, the joint 59 is made by etching the matrix material away from the superconductors 57 and 34i in a bath of molten tin, thereby exposing filaments 68, and then molding the filaments together in a superconductive solder material 72, such as lead-bismuth. As shown in FIG. 1, a similar joint 59 is made between the channel 54o, the leads 1o, 2o and a lead 58 from the circuit with which the connection is to be made.

Figure 2:
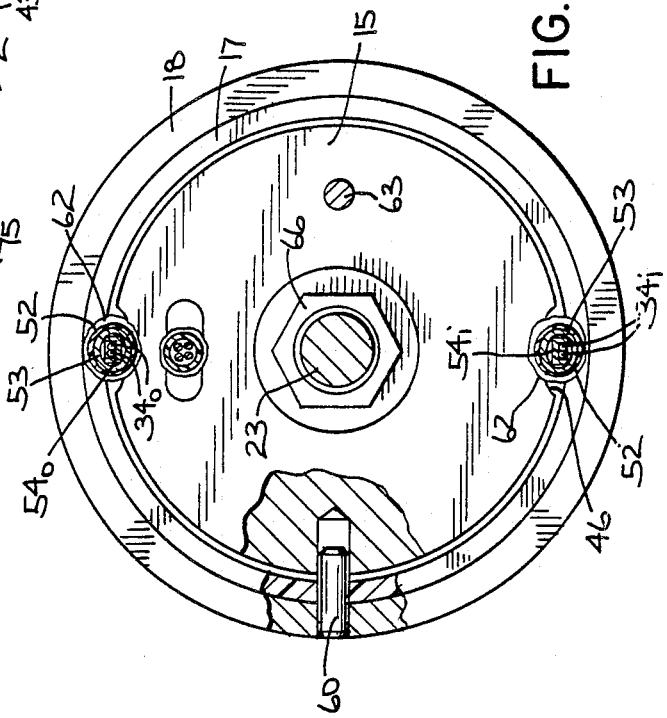
FIG. 2 is a sectional view taken along the plane of the line 2—2 of FIG. 1 with a portion broken away.
Figure 10:
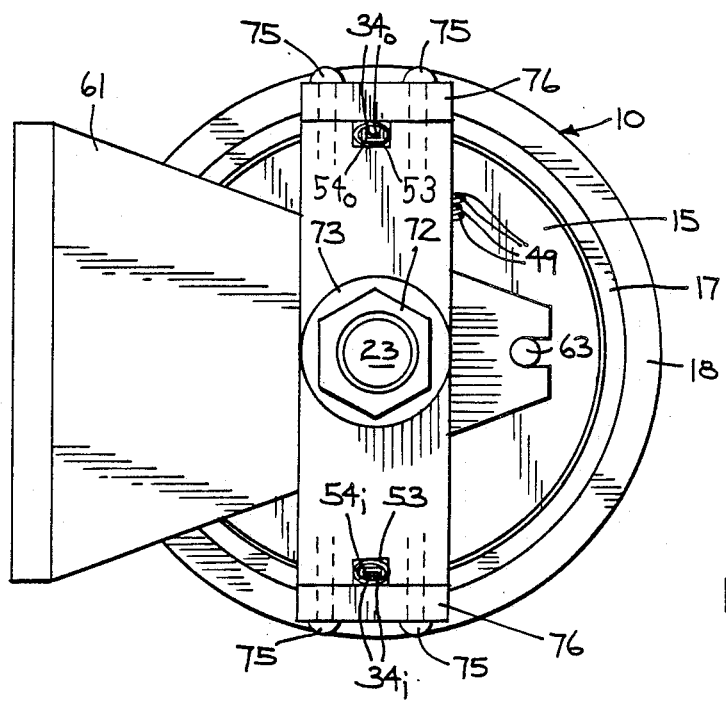
FIG. 10 is a sectional view taken from the plane of the line 10—10 of FIG. 1.

To complete the construction of the switch 10, the outer housing 18, which is made of aluminum or other material of a high coefficient of thermal expansion, is slid over the nylon sleeve 17 and a pin 60 (FIG. 2) is press fitted through the housing 18, nylon sleeve 17 and into the end plate 15 to prevent relative rotation therebetween. Another pin 63 (FIGS. 1 and 10) is also held in the end of a support bracket 61 for stationary mounting of the switch 10, and the pin is press fitted into the end plates 15 and 13 and into the core 12. Thus, rotation between the core 12, end plate 13, end plate 15, sleeve 17, housing 18 and support 61 is prevented. The threaded stud 23 extends through the entire assembly and nuts 65 and 66 bear against washers against the end plates 15 and 16 to hold the assembly axially together. The stud 23 extends slightly beyond the nut 65 and is threaded into a suitable mounting bracket 67 which can also be fixedly mounted. The stud 23 also extends past nut 66 through the support bracket 61 and a nut 69 sandwiches a washer 70 and the mounting bracket 61 against the nut 66. The stud next extends through a brace 71 which is mounted on the end of the stud 23 with a nut 72 and washer 73. The brace 71 is made of an electrically insulating material and has apertures formed in it through which the lead assemblies (comprising the braid 53-channels 54i, 54o-leads 34i, 34o, respectively) extend. Set screws 75 bear against end plates 76 to secure the lead assemblies in place.

The superconducting wire 1 and 2 is a cupro-nickel matrix niobium-titanium multifilamentary (576 filaments) superconducting composite conductor. Preferably, the superconducting material of the filaments is 46.5 plus or minus 1.5 weight percent titanium. The matrix material is 70% copper, 30% nickel with a nominal resistivity of $3.2 \times 10^{-5}$ ohm-cm at room temperature. The outer jacket of the wire is 90% copper, 10% nickel with a nominal resistivity of $1.5 \times 10^{-5}$ ohm-cm at room temperature. The volume ratio of cupro-nickel to niobium-titanium is nominally 1.10:1 in the final conductor. Each wire is also fully cured formvar varnish coated for insulation.

The diameter of each wire prior to insulation is preferably 0.041 inches nominally and its length is about 39 feet inside the switch (not counting the leads). The insulated wire diameter is nominally 0.044 inches. The equivalent average filament size in the final conductor is preferably 29 microns in diameter nominally and should not be greater than about 32 microns. The twist pitch length of the wire should be 1.0 plus or minus 0.25 inches. As such, the minimum critical current of this wire should be 630 amps in a magnetic field of 5 Tesla at 4.2 degrees Kelvin. In addition, the resistance of the switch 10 when "off" is about 2.2 ohms.

A switch constructed as described was tested in a sample test dewar for maximum current carrying capacity in different magnetic fields from 0T to 5T. The power supply used had a maximum current of 1520 amps. The following table shows the maximum currents reached by this switch during these tests.

| Field (Tesla) | Current (amps) |
|---|---|
| 0.0 | 1520 (held 2 min, no quench) |
| 0.3 | 1520 (held 2 min, no quench) |

| Field (Tesla) | Current (amps) |
|---|---|
| 0.5 | 1520 (held 2 min, no quench) |
| 1.0 | 1520 (held 2 min, no quench) |
| 2.0 | 1360 |
| 3.0 | 1465 |
| 4.0 | 1195 |
| 5.0 | 1090 |

Other switches were also constructed using this same basic construction and tested for maximum current carrying capacity in fields from 0T to 5T. One such switch was made using two wires, as described above, but each wire's length within the switch was 195 feet, the switch being wound in five layers and made longer. Another switch was wound with three wires, each wire being 130 feet long inside the switch and wound in five layers, with the housing length adjusted accordingly. The lead construction was substantially the same for all these switches as that described. The power supply used in these tests also had a maximum current of 1520 amps. The maximum currents reached by these switches during these tests are as follows:

| Field (Tesla) | 2 wire | 3 wire |
|---|---|---|
| 0.0 | 1520 (held 2 min., no quench) | 1518 |
| 0.3 | 1520 (held 2 min., no quench) | Not available |
| 0.5 | 1520 (held 2 min., no quench) | 1518 (held 2 min., no quench) |
| 1.0 | 1220 | 1518 |
| 2.0 | 770 | 955 |
| 3.0 | 605 | 825 |
| 4.0 | 510 | 660 |
| 5.0 | 455 | 585 |

Thus, it is apparent that the invention provides a high current capacity switch using cupro-nickel matrix superconductor. Moreover, a switch constructed according to the invention, such as that first described above for the charging circuit of a 0.5T MR magnet coil, can hold the magnetic field drift of the magnet to less than 0.1 ppm/hour.

Many modifications and variations of the preferred embodiment will be apparent to those of ordinary skill in the art but will still be within the spirit and scope of the invention. Therefore, the invention should not be limited by the scope of the preferred embodiment, but only by the claims which follow.

I claim:

1. A superconducting switch, comprising:
   a core;
   a heater element wrapped around the core;
   at least two separate lengths of superconducting wire bifilarly wound in at least one layer around the core, said bifilar winding of each wire being made by bending the wire in the middle and starting the winding around the core at the bend, each wire having an input portion on one side of the bend and an output portion on the other side of the bend so that two wire portions from each wire are wound in side by side relation to make up each layer of wire windings;
   a casing enclosing the core, heater element and wire windings;
   a solid body filling the voids between the casing and the core to restrain the wire against movement;
   wherein each superconducting wire comprises a multitude of filaments of superconducting material held in a cupro-nickel matrix and the diameter of each filament is less than approximately 32 microns; and
   the switch is capable of conducting a persistnet current of at least approximately 1500 amperes in an external magnetic field of zero Tesla.

2. A superconducting switch as in claim 1, wherein the input portions of the wires are adjacent to one another in the wire windings and the output portions are adjacent to one another in the wire windings so that in cross section the groups of input portions and groups of output portions in the wire windings alternate within each layer.

3. A superconducting switch as in claim 1, wherein the input portions exit the switch together and are in electrical contact with one another and the output portions exit the switch together and are in electrical contact with one another and further comprising a stabilizer made of a material having a higher electrical conductivity than the cupro-nickel matrix of the superconductors for each group of input and output portions, each stabilizer being in electrical continuity with the corresponding group of portions outside of the switch and into the switch with an inside end of the stabilizer being embedded in the solid body.

4. A superconducting switch as in claim 3, further comprising a superconducting joint at the free ends of each group of input and output portions and wherein each stabilizer of the groups of input and output portions is in electrical continuity with the corresponding group from inside the solid body to inside the corresponding superconducting joint.

5. A superconducting switch as in claim 4, wherein each stabilizer is a U-shaped channel and the cupro-nickel matrix superconductors are soldered to the stabilizer along its length inside the channel.

6. A superconducting switch as in claim 1, wherein the winding of each wire is started about 180 degrees away from the winding of another wire and the input portions are extracted from the switch about 180 degrees apart from the output portions.

7. A superconducting switch as in claim 3, further comprising a support braid around each of the stabilizers where they exit the switch.

8. A superconducting switch, comprising:
   a solid body;
   a heater element encased by the solid body;
   at least two separate lengths of cupro-nickel matrix superconducting wire bifilarly wound in at least one layer within the solid body, said bifilar winding of each wire being made by bending the wire in the middle and starting the winding at the bend, each wire having an input portion on one side of the bend and an output portion on the other side of the bend, each said input portion being wound within the solid body and exiting the solid body to provide an input lead outside of the solid body and each said output portion being wound within the solid body and exiting the solid body to provide an output lead outside of the solid body;
   a superconducting joint at the end of each lead; and
   a stabilizer made of a material having a higher electrical conductivity than the cupro-nickel matrix of the superconductors of the input and output leads, each stabilizer being joined to the corresponding leads in electrical continuity therewith outside of the switch from the solid body to the joint.

9. A superconducting switch as in claim 8, wherein each stabilizer extends into the switch and is embedded therein.

10. A superconducting switch as in claim 8, wherein each stabilizer extends into the corresponding joint.

11. A superconducting switch as in claim 8, wherein each stabilizer extends from inside the switch to inside the corresponding joint.

12. A superconducting switch as in claim 8, further comprising a braid surrounding at least a portion of the length of at least one of the stabilizers, said braid being electrically conductive.

13. A superconducting switch as in claim 12, wherein the braid and each stabilizer surrounded by the braid extend into the switch and are embedded therein.

* * * * *